(12) United States Patent
Lee et al.

(10) Patent No.: US 11,749,319 B2
(45) Date of Patent: Sep. 5, 2023

(54) INTEGRATED CIRCUIT CHIP

(71) Applicant: SK hynix Inc., Gyeonggi-do (KR)

(72) Inventors: Chang Kwon Lee, Gyeonggi-do (KR); Ji Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 17/693,979

(22) Filed: Mar. 14, 2022

(65) Prior Publication Data

US 2023/0170001 A1    Jun. 1, 2023

(30) Foreign Application Priority Data

Nov. 26, 2021   (KR) .......................... 10-2021-0166199

(51) Int. Cl.
*G11C 7/10* (2006.01)
*G11C 8/18* (2006.01)

(52) U.S. Cl.
CPC .......... *G11C 7/1063* (2013.01); *G11C 7/1039* (2013.01); *G11C 7/1042* (2013.01); *G11C 7/1069* (2013.01); *G11C 8/18* (2013.01)

(58) Field of Classification Search
CPC ... G11C 7/1063; G11C 7/1039; G11C 7/1042; G11C 7/1069; G11C 8/18
See application file for complete search history.

(56) References Cited

U.S. PATENT DOCUMENTS

| | | | |
|---|---|---|---|
| 8,396,682 B2 * | 3/2013 | Oh ................... | G01R 31/31726 702/120 |
| 9,245,827 B2 * | 1/2016 | Kang ....................... | G11C 8/18 |
| 10,748,601 B2 | 8/2020 | Kim et al. | |
| 11,049,584 B2 | 6/2021 | Kim et al. | |
| 11,139,041 B2 * | 10/2021 | Lee .......................... | G11C 7/22 |

FOREIGN PATENT DOCUMENTS

KR    10-0927397 B1    11/2009

* cited by examiner

*Primary Examiner* — Son L Mai
(74) *Attorney, Agent, or Firm* — IP & T GROUP LLP (57) ABSTRACT

An integrated circuit (IC) chip includes a plurality of interlayer channels; at least one data pad; an identification (ID) generation circuit suitable for generating a chip ID signal by decoding a command/address signal; a first transmission circuit suitable for transferring a plurality of internal data pieces to a transmission path by aligning a plurality of interlayer data pieces respectively transferred from the plurality of interlayer channels according to a plurality of strobe signals while selectively inverting the plurality of interlayer data pieces according to the chip ID signal; and a second transmission circuit suitable for transferring the plurality of internal data pieces from the transmission path to the at least one data pad.

18 Claims, 8 Drawing Sheets

| INTERLAYER DATA | SID<1:0> | | | | | | | |
|---|---|---|---|---|---|---|---|---|
| TSV_Dx | 00 | | 01 | | 10 | | 11 | |
| H | 1 | 1 | 0 | 1 | 1 | 0 | 0 | 0 |
| L | 0 | 0 | 1 | 0 | 0 | 1 | 1 | 1 |

INTEGRATED CIRCUIT CHIP

CROSS-REFERENCE TO RELATED APPLICATION

The present application claims priority to Korean Patent Application No. 10-2021-0166199, filed on Nov. 26, 2021, which is incorporated herein by reference in its entirety.

BACKGROUND

1. Field

Various embodiments of the present invention relate to semiconductor design technology, and more particularly, to an integrated circuit (IC) chip capable of configuring a stacked semiconductor device.

2. Description of the Related Art

As semiconductor technology makes dramatic progress, semiconductor integrated devices such as packages are required to have a higher degree of integration and performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate.

Moreover, in addition to a method for testing the stacked semiconductor device at a stack level after the semiconductor chips are stacked, there is a need for a method for testing each semiconductor chip at a wafer level before the semiconductor chips are stacked.

SUMMARY

Various embodiments of the present invention are directed to a stacked semiconductor device capable of testing a base chip which configures a stacked semiconductor device, at a wafer level.

In accordance with an embodiment of the present invention, an integrated circuit (IC) chip includes a plurality of interlayer channels; at least one data pad; an identification (ID) generation circuit suitable for generating a chip ID signal by decoding a command/address signal; a first transmission circuit suitable for transferring a plurality of internal data pieces to a transmission path by aligning a plurality of interlayer data pieces respectively transferred from the plurality of interlayer channels according to a plurality of strobe signals while selectively inverting the plurality of interlayer data pieces according to the chip ID signal; and a second transmission circuit suitable for transferring the plurality of internal data pieces from the transmission path to the at least one data pad.

In accordance with an embodiment of the present invention, an integrated circuit (IC) chip includes at least four interlayer channels; at least one data pad; an inversion control circuit suitable for generating a first flip signal and a second flip signal by decoding a chip identification (ID) signal according to a plurality of strobe signals; an inversion circuit suitable for outputting first to fourth inversion data pieces by selectively inverting, according to the first flip signal and the second flip signal, first to fourth interlayer data pieces transferred from the at least four interlayer channels; a latch circuit suitable for outputting first to fourth internal data pieces to a transmission path by latching the first to fourth inversion data pieces according to the plurality of strobe signals; and a transmission circuit suitable for serializing the first to fourth internal data pieces to transfer the serialized data from the transmission path to the at least one data pad.

In accordance with an embodiment of the present invention, an operating method of an integrated circuit chip includes generating chip ID bits based on a command/address signal; generating, according to first and second strobe signals, a first flip signal from the chip ID bits latched according to the first strobe signal; generating, according to third and fourth strobe signals, a second flip signal from the chip ID bits latched according to the third strobe signal; generating first and second inversion data pieces by selectively inverting first and second interlayer data pieces according to the first flip signal; generating third and fourth inversion data pieces by selectively inverting third and fourth interlayer data pieces according to the second flip signal; generating a first internal data piece from the first inversion data piece according to the first and second strobe signals; generating a second internal data piece from the second inversion data piece according to the first and second strobe signals; generating a third internal data piece from the third inversion data piece according to the third and fourth strobe signals; generating a fourth internal data piece from the fourth inversion data piece according to the third and fourth strobe signals; and outputting the first to fourth internal data pieces through a single data pad, wherein the first to fourth strobe signals have different phases, and wherein the first to fourth interlayer data pieces are provided respectively from first to fourth interlayer channels included in the integrated circuit chip.

In accordance with the present technology, various test patterns may be generated according to a chip ID signal that is generated based on the command/address signal, and the read path of the base chip is tested at the wafer level using the generated test pattern, thereby improving reliability of a stacked semiconductor device including the base chip.

These and other features and advantages of the present invention will become apparent to those skilled in the art from the following detailed description in conjunction with the following drawings.

DETAILED DESCRIPTION

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will convey the scope of the present teachings to those skilled in the art. Throughout the disclosure, like reference numerals refer to like parts throughout the various figures and embodiments of the present invention.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present teachings.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from context to be directed to a singular form.

A semiconductor memory system in accordance with an embodiment of the present invention may be embodied in the form of a system-in-package, a multi-chip package, or a system-on-chip, and it may also be embodied in the form of a package-on-package. Hereinafter, a semiconductor memory system will be described as an example of a stacked semiconductor device.

Figure 1:
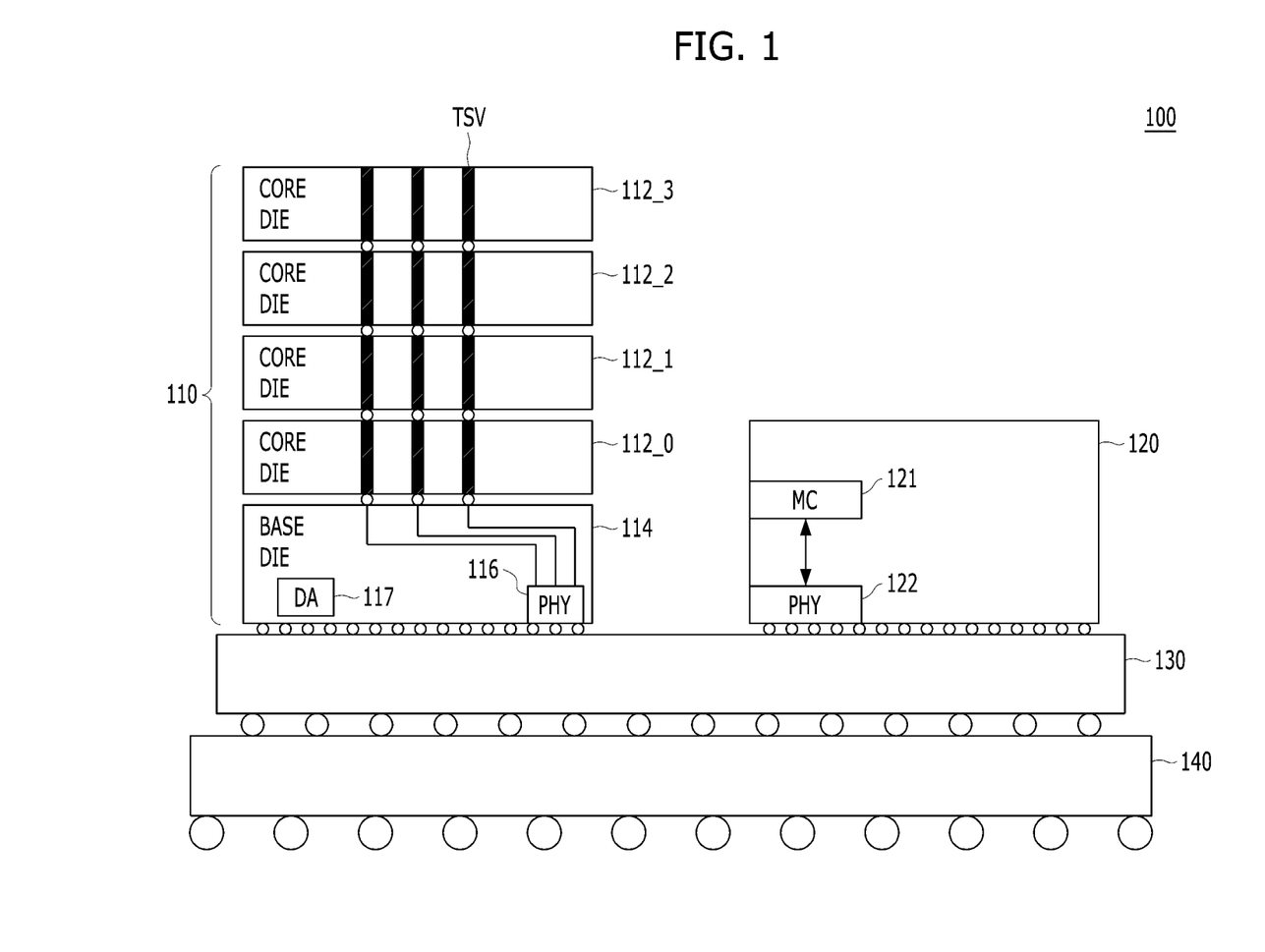
FIG. 1 is a cross-sectional diagram illustrating a memory system including a stacked memory device in accordance with an embodiment of the present invention.

FIG. 1 is a cross-sectional diagram illustrating a memory system 100 including a stacked memory device 110 in accordance with various embodiments of the present invention.

Referring to FIG. 1, the memory system 100 may include a stacked memory device 110, a processor 120, an interposer 130, and a package substrate 140.

The interposer 130 may be mounted onto the package substrate 140.

The stacked memory device 110 and the processor 120 may be mounted onto the interposer 130.

The processor 120 may include a memory controller (MC) 121 and a PHY interface 122 for an interface with the memory controller 121. The PHY interface 122 may be used by the memory controller 121 to communicate with the stacked memory device 110. The processor 120 may be one among various processors, such as a Graphic Processing Unit (GPU), a Central Processing Unit (CPU), and an Application Processor (AP).

The stacked memory device 110 may include a base chip 114 and core chips 112_0 to 112_3 that are stacked over the base chip 114. An example of the stacked memory device 110 formed by stacking a plurality of chips as described above may be a high bandwidth memory (HBM).

Each of the core chips 112_0 to 112_3 may include a cell array for storing data and circuits for writing data to and reading data from a cell array. The base chip 114 may include circuits for the interface between the core chips 112_0 to 112_3 and the base chip 114 and circuits for the interface between the base chip 114 and the memory controller 121. The base chip 114 may also be referred to as a base die. A plurality of through silicon vias TSV may be formed between the stacked core chips 112_0 to 112_3, and through the through silicon vias TSV, commands, addresses and data may be transferred between the core chips 112_0 to 112_3 and the base chip 114.

The PHY interface 116 of the base chip 114 may be an interface for communication between the base chip 114 and the memory controller 121, and a direct access (DA) interface 117 may be an interface for testing the stacked memory device 110. The PHY interface 116 may be coupled to the interposer 130 through micro bumps, and the interposer 130 may electrically connect the PHY interface 116 of the base chip 114 to the PHY interface 122 of the memory controller 121 through internal interconnections (not shown). Further, the PHY interfaces 116 and 122 may be electrically connected to communicate with each other through the interposer 130. The PHY interface 116 may be coupled to the interposer 130 through more than 1000 micro bumps. Since the physical number of the micro bumps is very large, in reality, it is very difficult to test the stacked memory device 110 by using the PHY interface 116. For this reason, the DA interface 117 interfaced by using direct access pads whose number is relatively smaller than that of the micro bumps and whose physical size is relatively larger than those of the micro bumps may be used for testing the stacked memory device 110.

The package substrate 140 may include solder balls for supplying power to the stacked memory device 110 and the processor 120 and solder balls for the processor 120 to communicate with the outside (e.g., other chips on a graphics card). The package substrate 140 may be coupled to, for example, a graphic card.

Furthermore, the base chip and the core chips may be individually manufactured and then combined and stacked, and may be individually tested before being combined and stacked. That is, the base chip may also be tested for defects by inputting and outputting data at a wafer level before being coupled to the core chips. However, since the base chip does not include a cell array for storing data, there is a limit to testing input/output lines for data of various patterns.

Hereinafter, in accordance with an embodiment of the present invention, a method for testing a base chip for configuring a stacked semiconductor device, at a wafer level, will be described.

Figure 2:
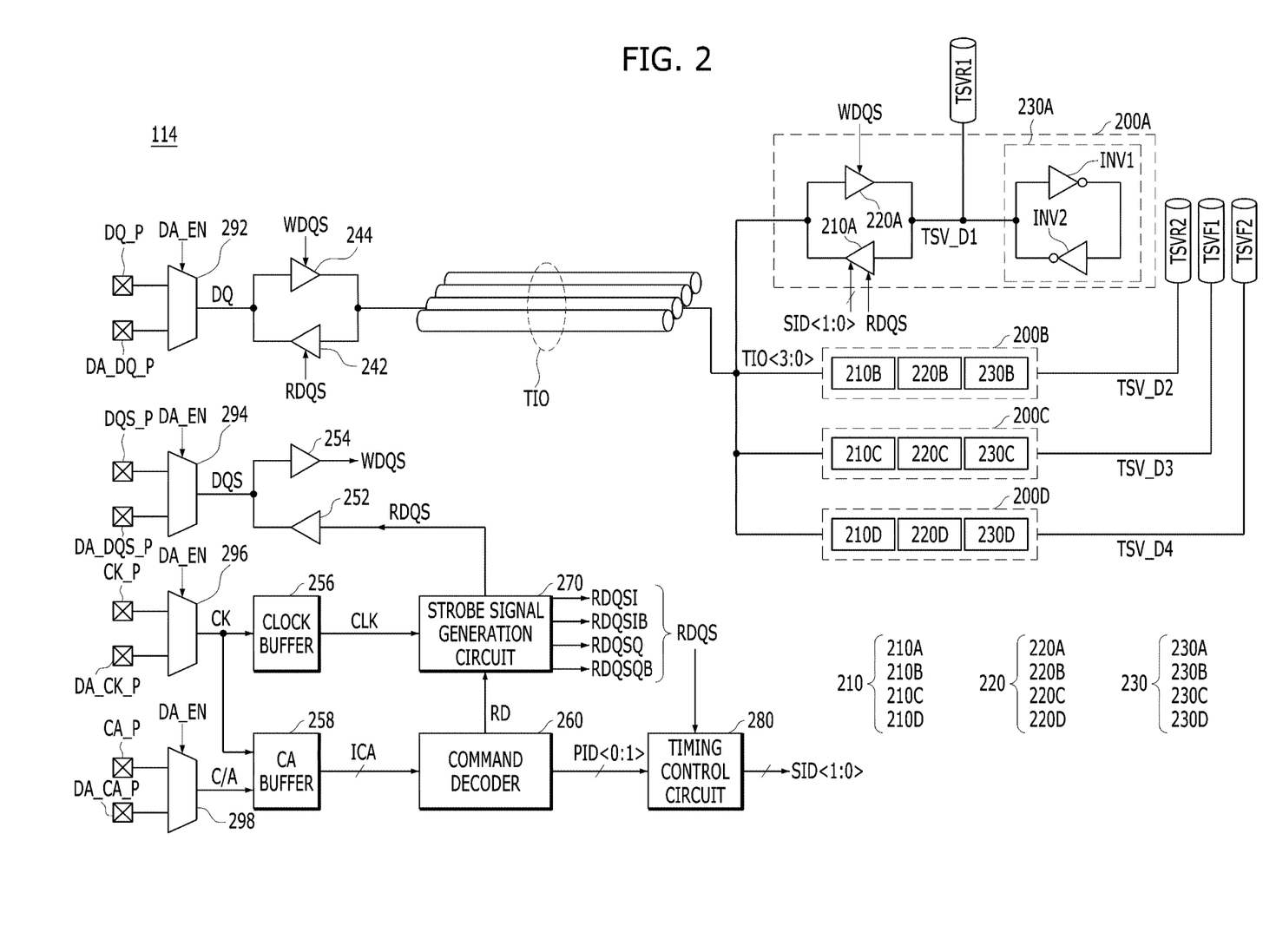
FIG. 2 is a configuration diagram illustrating a base chip of FIG. 1 in accordance with an embodiment of the present invention.

FIG. 2 is a configuration diagram illustrating the base chip 114 of FIG. 1 in accordance with an embodiment of the present invention.

Referring to FIG. 2, a data pad DQ_P, a strobe pad DQS_P, a clock pad CK_P, and a command/address pad CA_P may be disposed in the base chip 114. The data pad DQ_P, the strobe pad DQS_P, the clock pad CK_P, and the command/address pad CA_P may be disposed in the PHY interface 116 of the base chip 114 shown in FIG. 1. A micro bump may be coupled to the data pad DQ_P, the strobe pad DQS_P, the clock pad CK_P, and the command/address pad CA_P to be coupled to the interposer 130, and may be coupled to the PHY interface 122 of the processor 120 through the interposer 130 shown in FIG. 1.

The data pad DQ_P may be provided to transmit and receive data DQ to and from an external device, e.g., the memory controller 121. A plurality of data pads DQ_P may exist in the PHY interface 116 of the base chip 114, and only one data pad DQ_P is illustrated in FIG. 2.

The strobe pad DQS_P may be provided to transmit and receive a strobe signal DQS to and from the memory controller 121.

The clock pad CK_P may be provided to receive a clock signal CK from the memory controller 121.

The command/address pad CA_P may be provided to receive a command/address signal C/A from the memory controller 121. A plurality of command/address pads CA_P may exist in the PHY interface 116 of the base chip 114, and only one command/address pad CA_P is illustrated in FIG. 2.

Furthermore, a data pad DA_DQ_P, a strobe pad DA_DQS_P, a clock pad DA_CK_P, and a command/address pad DA_CA_P may be disposed in the base chip 114. The data pad DA_DQ_P, the strobe pad DA_DQS_P, the clock pad DA_CK_P, and the command/address pad DA_CA_P may be disposed in the DA interface 117 of the base chip 114 shown in FIG. 1. That is, the data pad DA_DQ_P, the strobe pad DA_DQS_P, the clock pad DA_CK_P, and the command/address pad DA_CA_P may be composed of direct access pads to be coupled to an external test device.

The data pad DA_DQ_P may be provided to transmit and receive the data DQ to and from the external test device. A plurality of data pads DA_DQ_P may exist in the DA interface 117 of the base chip 114, and only one data pad DA_DQ_P is illustrated in FIG. 2.

The strobe pad DA_DQS_P may be provided to transmit and receive the strobe signal DQS to and from the external test device.

The clock pad DA_CK_P may be provided to receive the clock signal CK from the external test device.

The command/address pad DA_CA_P may be provided to receive the command/address signal C/A from the external test device. A plurality of command/address pads DA_CA_P may exist in the DA interface 117 of the base chip 114, and only one command/address pad DA_CA_P is illustrated in FIG. 2.

The base chip 114 may include first to fourth selection circuits 292 to 298.

The first selection circuit 292 may select a signal from one of the data pad DQ_P and the data pad DA_DQ_P according to a direct access (DA) mode signal DA_EN, and transfer the selected signal as the data DQ to inside. The first selection circuit 292 may transfer the data DQ from inside to one of the data pad DQ_P and the data pad DA_DQ_P according to the DA mode signal DA_EN. For reference, the DA mode signal DA_EN may be enabled in a DA mode for receiving test signals from the external test device through the DA interface 117. For example, the DA mode may include a test operation. That is, the DA mode signal DA_EN may be enabled for the test operation. In the DA mode, the first selection circuit 292 may select and transfer the signal provided by the external test device through the data pad DA_DQ_P, as the data DQ, to inside, or may transfer the data DQ outputted from inside to the external test device through the data pad DA_DQ_P.

The second selection circuit 294 may select a signal from one of the strobe pad DQS_P and the strobe pad DA_DQS_P according to the DA mode signal DA_EN, and transfer the selected signal as the strobe signal DQS to inside. The second selection circuit 294 may transfer the strobe signal DQS from inside to one of the strobe pad DQS_P and the strobe pad DA_DQS_P according to the DA mode signal DA_EN. In the DA mode, the second selection circuit 294 may select and transfer the signal provided by the external test device through the strobe pad DA_DQS_P, as the strobe signal DQS, to inside, or may transfer the strobe signal DQS outputted from inside to the external test device through the strobe pad DA_DQS_P.

The third selection circuit 296 may select a signal from one of the clock pad CK_P and the clock pad DA_CK_P according to the DA mode signal DA_EN, and transfer the selected signal as the clock signal CK to inside. In the DA mode, the third selection circuit 296 may select and transfer the signal provided by the external test device through the clock pad DA_CK_P, as the clock signal CK, to inside.

The fourth selection circuit 298 may select a signal from one of the command/address pad CA_P and the command/address pad DA_CA_P according to the DA mode signal DA_EN, and transfer the selected signal as the command/address signal C/A to inside. In the DA mode, the fourth selection circuit 298 may select and transfer the signal provided by the external test device through the command/address pad DA_CA_P, as the command/address signal C/A, to inside.

The base chip 114 may include a plurality of interlayer channels TSVR1, TSVR2, TSVF1 and TSVF2, and a plurality of interlayer driving circuits 200A to 200D for respectively driving interlayer channels TSVR1, TSVR2, TSVF1 and TSVF2.

The interlayer channels TSVR1, TSVR2, TSVF1 and TSVF2 and the interlayer driving circuits 200A to 200D may be disposed in a TSV region between the PHY interface 116 and the DA interface 117 of the base chip 114. The interlayer channels TSVR1, TSVR2, TSVF1 and TSVF2 may be channels for transmitting and receiving data to and from chips (i.e., the core chips 112_0 to 112_3) stacked over the base chip 114. The interlayer channels TSVR1, TSVR2, TSVF1 and TSVF2 may include through-electrodes for communication between stacked chips, or connections coupled to the through-electrodes. Though FIG. 2 shows four interlayer channels TSVR1, TSVR2, TSVF1 and TSVF2 corresponding to one data pad DQ_P (or the data pad DA_DQ_P), the present invention is not limited thereto. Depending on an embodiment, two or more interlayer channels and two or more interlayer driving circuits corresponding to at least one data pad DQ_P may exist in the base chip 114.

The interlayer driving circuits 200A to 200D may include a first transmission circuit 210, a first reception circuit 220, and an interlayer latch circuit 230. The first transmission circuit 210 may include first to fourth transmitters 210A to 210D respectively disposed in the interlayer driving circuits 200A to 200D. The first reception circuit 220 may include first to fourth receivers 220A to 220D respectively disposed in the interlayer driving circuits 200A to 200D. The interlayer latch circuit 230 may include first to fourth latch circuits 230A to 230D respectively disposed in the interlayer driving circuits 200A to 200D.

The first transmission circuit 210 may align first to fourth interlayer data pieces TSV_D1 to TSV_D4 respectively transferred from the first to fourth interlayer channels TSVR1, TSVR2, TSVF1 and TSVF2 according to a read strobe signal RDQS, and transfer the aligned data as first to fourth internal data pieces TIO<3:0> to a transmission path TIO. In particular, the first transmission circuit 210 may transfer the first to fourth internal data pieces TIO<3:0> to the transmission path TIO by selectively inverting each phase of the first to fourth interlayer data pieces TSV_D1 to TSV_D4 according to a chip identification (ID) signal SID<1:0>. A detailed configuration and operation of the first transmission circuit 210 will be described in FIGS. 5 to 7.

The first reception circuit 220 may receive the first to fourth internal data pieces TIO<3:0> from the transmission path TIO according to a write strobe signal WDQS, and provide the received data as the first to fourth interlayer data pieces TSV_D1 to TSV_D4 to the first to fourth interlayer channels TSVR1, TSVR2, TSVF1 and TSVF2.

The interlayer latch circuit 230 may store and maintain the first to fourth interlayer data pieces TSV_D1 to TSV_D4 of the first to fourth interlayer channels TSVR1, TSVR2, TSVF1 and TSVF2. Each of the first to fourth latch circuits 230A to 230D of the interlayer latch circuit 230 may include cross-coupled inverters INV1 and INV2 coupled to a corresponding interlayer channel.

Further, the base chip 114 may include a second transmission circuit 242, a second reception circuit 244, a third transmission circuit 252, a third reception circuit 254, a clock buffer 256, a command/address (CA) buffer 258, a command decoder 260, a strobe signal generation circuit 270, and a timing control circuit 280.

The second transmission circuit 242 may output the first to fourth internal data pieces TIO<3:0> from the transmission path TIO to any of the data pad DQ_P and the data pad DA_DQ_P through the first selection circuit 292. The second transmission circuit 242 may serialize the first to fourth internal data pieces TIO<3:0> according to the read strobe signal RDQS.

The second reception circuit 244 may receive the data DQ from any of the data pad DQ_P and the data pad DA_DQ_P through the first selection circuit 292, and provide the first to fourth internal data pieces TIO<3:0> to the transmission path TIO. The second reception circuit 244 may deserialize the data DQ according to the write strobe signal WDQS.

The third transmission circuit 252 may output the read strobe signal RDQS to any of the strobe pad DQS_P and the strobe pad DA_DQS_P through the second selection circuit 294.

The third reception circuit 254 may receive the strobe signal DQS as the write strobe signal WDQS from any of the strobe pad DQS_P and the strobe pad DA_DQS_P through the second selection circuit 294.

The clock buffer 256 may receive the clock signal CK from any of the clock pad CK_P and the clock pad DA_CK_P through the third selection circuit 296. The clock buffer 256 may generate an internal clock signal CLK by buffering the clock signal CK. Depending on an embodiment, clock signals CK_t and CK_c may be provided to the base chip 114 in a differential manner, and the base chip 114 may include clock buffers that receive the differential clock signals CK_t and CK_c, respectively.

The CA buffer 258 may receive the command/address signal C/A from any of the command/address pad CA_P and the command/address pad DA_CA_P through the fourth selection circuit 298, based on the clock signal CK. The CA buffer 258 may generate an internal command/address signal ICA by sampling the command/address signal C/A using the clock signal CK.

The command decoder 260 may generate various commands required for operations of the base chip 114, by decoding the internal command/address signal ICA. According to an embodiment, the command decoder 260 may generate a read command RD and a preliminary ID signal PID<1:0> by decoding the internal command/address signal ICA. For example, the command decoder 260 may generate the preliminary ID signal PID<1:0> by decoding some bits of the internal command/address signal ICA. The preliminary ID signal PID<1:0> may be provided for selecting any of the stacked chips (i.e., the core chips 112_0 to 112_3). For example, the preliminary ID signal PID<1:0> may be composed of 2 bits so as to select one of 4 chips.

The strobe signal generation circuit 270 may generate the read strobe signal RDQS based on the internal clock signal CLK when the read command RD is inputted. The strobe signal generation circuit 270 may generate first to fourth strobe signals RDQSI, RDQSIB, RDQSQ and RDQSQB, which have different phases, and generate the read strobe signal RDQS using the first to fourth strobe signals RDQSI, RDQSIB, RDQSQ and RDQSQB. For example, the first strobe signal RDQSI may have an opposite phase to the second strobe signal RDQSIB, and the third strobe signal RDQSQ may have an opposite phase to the fourth strobe signal RDQSQB. The first strobe signal RDQSI, the third strobe signal RDQSQ, the second strobe signal RDQSIB, and the fourth strobe signal RDQSQB may have phases different by 90 degrees. The strobe signal generation circuit 270 may generate the read strobe signal RDQS that is enabled according to the first strobe signal RDQSI, disabled according to the third strobe signal RDQSQ, enabled according to the second strobe signal RDQSIB, and disabled according to the fourth strobe signal RDQSQB.

Figure 3:
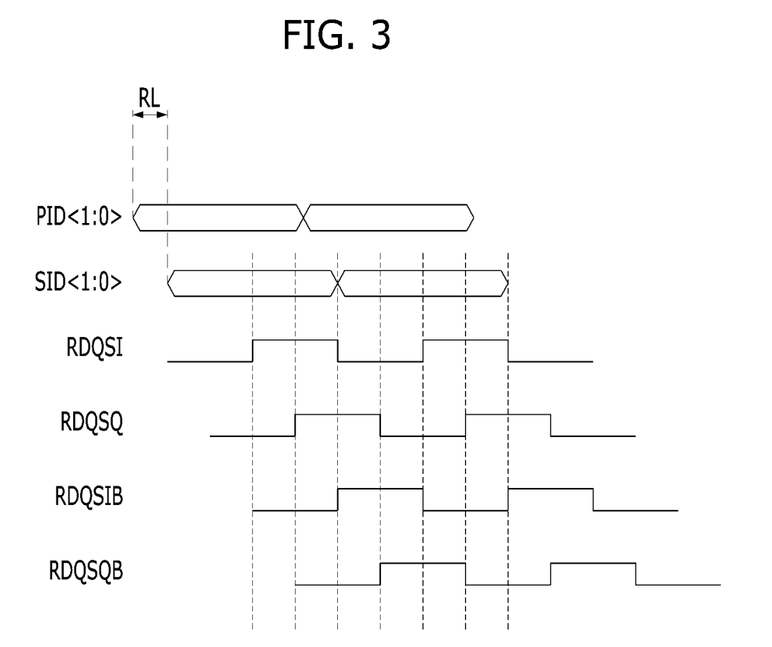
FIG. 3 is a waveform diagrams for describing an operation of a timing control circuit of FIG. 2 in accordance with an embodiment of the present invention.

The timing control circuit 280 may delay the preliminary ID signal PID<1:0> by a predetermined time amount corresponding to a read latency (RL), and generate the chip ID signal SID<1:0> by aligning the delayed preliminary ID signal according to the read strobe signal RDQS. Referring to FIG. 3, the chip ID signal SID<1:0> may be generated in a way that the preliminary ID signal PID<1:0> generated by decoding the internal command/address signal ICA is delayed by the read latency (RL), and then aligned according to the first to fourth strobe signals RDQSI, RDQSIB, RDQSQ and RDQSQB. The command decoder 260 and the timing control circuit 280 may be defined as an ID generation circuit for generating the chip ID signal SID<1:0> by decoding the command/address signal C/A.

During the test operation at the wafer level, a read test operation may be performed after a write test operation is performed only with the base chip 114 without the core chips 112_0 to 112_3. In this case, since the interlayer latch circuit 230 stores and maintains the interlayer data pieces TSV_D1 to TSV_D4 transmitted to the interlayer channels TSVR1, TSVR2, TSVF1 and TSVF2, the interlayer channels TSVR1, TSVR2, TSVF1 and TSVF2 are loaded with the last written data during the write test operation. When the read test operation is performed in this state, only a very monotonous single pattern of data without change in the phase of the data is transmitted through the transmission path TIO, so it may be difficult to verify characteristics of a read operation and to verify whether the transmission circuits 210 and 242 involved in the read test operation are operating properly.

In accordance with an embodiment, during the test operation at the wafer level, the timing control circuit 280 may generate the chip ID signal SID<1:0> based on the clock signal CK and the command/address signal C/A provided from the external test device. The first transmission circuit 210 may transfer the first to fourth internal data pieces TIO<3:0> to the transmission path TIO by selectively inverting each phase of the first to fourth interlayer data pieces TSV_D1 to TSV_D4 according to the chip ID signal SID<1:0>. The second transmission circuit 242 may output the first to fourth internal data pieces TIO<3:0> as the data DQ to the external test device through the data pad DA_DQ_P. Since the external test device already knows the value of the chip ID signal SID<1:0>, it is possible to verify whether the transmission circuits 210 and 242 involved in the read test operation operate properly using the data DQ. That is, various test patterns may be generated by inverting at least some data pieces of interlayer data according to the chip ID signal SID<1:0> originated from the command/address signal C/A, and a read path of the base chip 114 may be tested at the wafer level by using the generated test patterns, thereby improving the reliability of the base chip 114 and the stacked memory device 110 to be configured by the base chip 114.

In particular, in an embodiment of the present invention, when the chip ID signal SID<1:0> includes a plurality of bits, for example, a first bit SID<0> and a second bit SID<1>, the first transmission circuit 210 may transfer the first and second internal data pieces TIO<0:1> by inverting the phases of the first and second interlayer data pieces TSV_D1 and TSV_D2 according to the first and second strobe signals RDQSI and RDQSIB when any of the first bit SID<0> and the second bit SID<1> becomes a high bit. Alternatively, the first transmission circuit 210 may transfer the third and fourth internal data pieces TIO<2:3> by inverting the phases of the third and fourth interlayer data pieces TSV_D3 and TSV_D4 according to the third and fourth strobe signals RDQSQ and RDQSQB.

Figure 4:
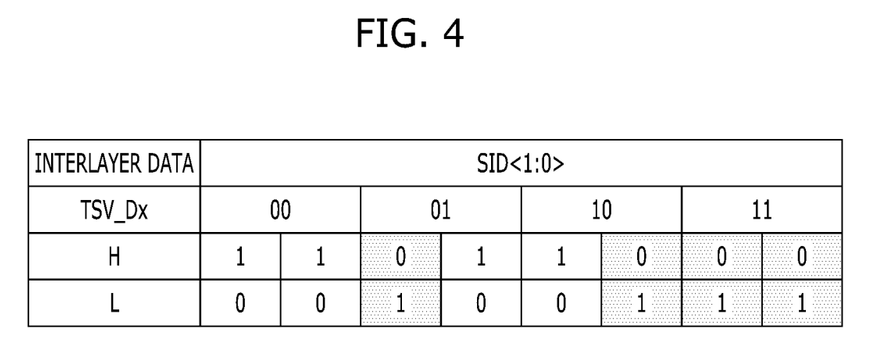
FIG. 4 is a table for describing an inversion operation on interlayer data according to a chip ID signal in accordance with an embodiment of the present invention.

FIG. 4 is a table for describing an inversion operation on the interlayer data piece TSV_Dx, where x is an integer from 1 to 4, according to the chip ID signal SID<1:0> in accordance with an embodiment of the present invention.

Referring to FIG. 4, when the chip ID signal SID<1:0> of "00" is inputted, the interlayer data piece TSV_Dx of a logic high level may be sequentially outputted to the internal data piece TIO<x-1> of "11" in synchronization with corresponding two strobe signals, and the interlayer data piece TSV_Dx of a logic low level may be sequentially outputted to the internal data piece TIO<x-1> of "00" in synchronization with the corresponding two strobe signals. When the chip ID signal SID<1:0> of "01" is inputted, i.e., the first bit SID<0> becomes a high bit, the interlayer data piece TSV_Dx of a logic high level may be sequentially outputted to the internal data piece TIO<x-1> of "01" in synchronization with corresponding two strobe signals, and the interlayer data piece TSV_Dx of a logic low level may be sequentially outputted to the internal data piece TIO<x-1> of "10" in synchronization with the corresponding two strobe signals. When the chip ID signal SID<1:0> of "10" is inputted, i.e., the second bit SID<1> becomes a high bit, the interlayer data piece TSV_Dx of a logic high level may be sequentially outputted to the internal data piece TIO<x-1> of "10" in synchronization with corresponding two strobe signals, and the interlayer data piece TSV_Dx of a logic low level may be sequentially outputted to the internal data piece TIO<x-1> of "01" in synchronization with the corresponding two strobe signals. When the chip ID signal SID<1:0> of "11" is inputted, the interlayer data piece TSV_Dx of a logic high level may be sequentially outputted to the internal data piece TIO<x-1> of "00" in synchronization with corresponding two strobe signals, and the interlayer data piece TSV_Dx of a logic low level may be sequentially outputted to the internal data piece TIO<x-1> of "11" in synchronization with the corresponding two strobe signals.

In sum, when the chip ID signal SID<1:0> of "00" is inputted, the interlayer data piece TSV_Dx may be outputted as the internal data piece TIO<x-1> without inversion. When the chip ID signal SID<1:0> of "01" or "10" is inputted, the interlayer data piece TSV_Dx may be selectively inverted and outputted as the internal data piece TIO<x-1>. When the chip ID signal SID<1:0> of "11" is inputted, the interlayer data piece TSV_Dx may be inverted and outputted as the internal data piece TIO<x-1>.

Hereinafter, referring to FIGS. 5 to 7, a detailed configuration of the first transmission circuit 210 will be described.

Figure 5:
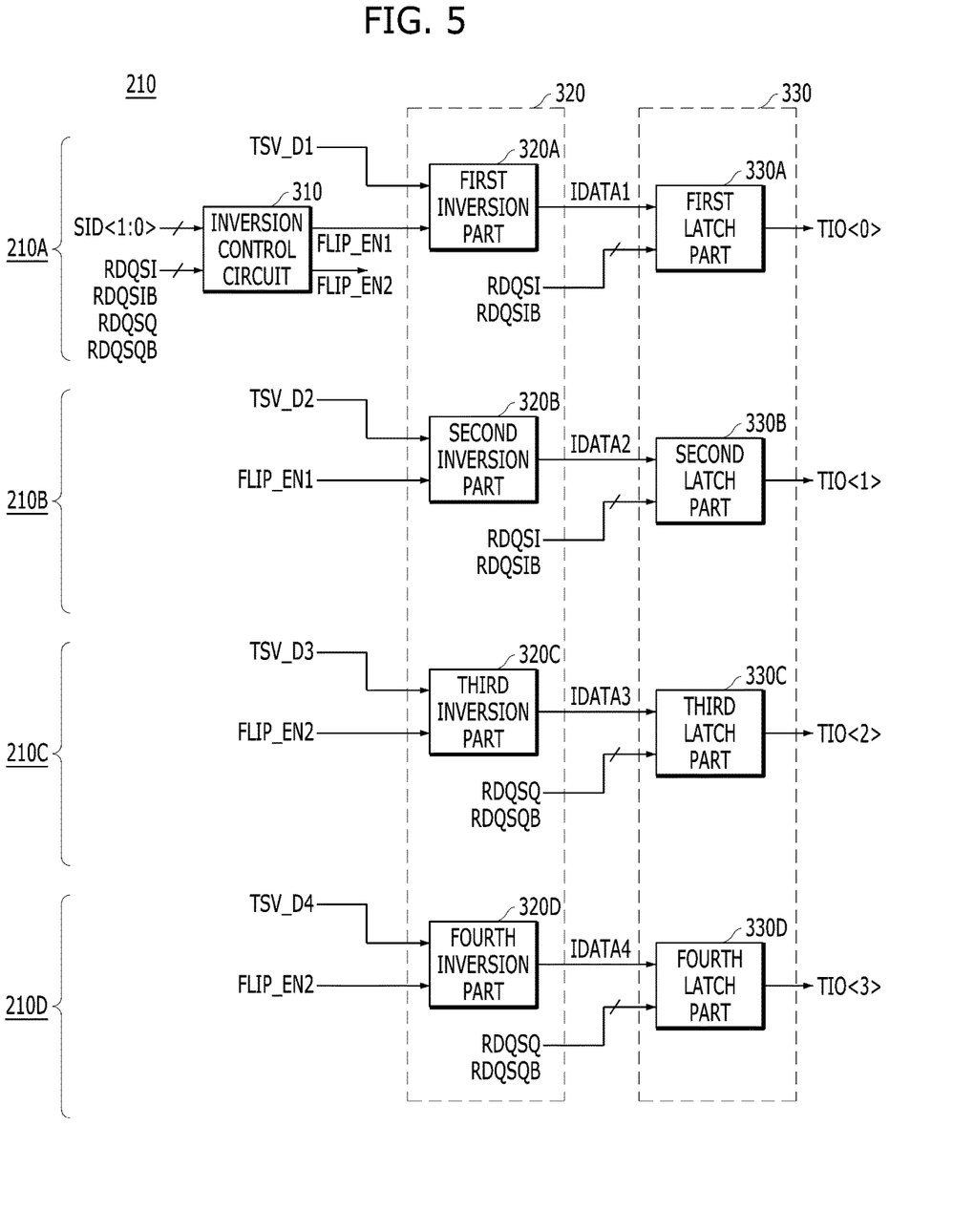
FIG. 5 is a detailed block diagram illustrating a first transmission circuit of FIG. 2 in accordance with an embodiment of the present invention.

FIG. 5 is a detailed block diagram illustrating the first transmission circuit 210 of FIG. 2 in accordance with an embodiment of the present invention.

Referring to FIG. 5, the first transmission circuit 210 may include an inversion control circuit 310, an inversion circuit 320, and a latch circuit 330. The inversion circuit 320 may include first to fourth inversion parts 320A to 320D respectively disposed in the first to fourth transmitters 210A to 210D. The latch circuit 330 include first to fourth latch parts 330A to 330D respectively disposed in the first to fourth transmitters 210A to 210D. The first transmission circuit 210 may include the first to fourth transmitters 210A to 210D, and the first transmitter 210A may include the inversion control circuit 310, the first inversion part 320A, and the first latch part 330A, and the second to fourth transmitters 210B to 210D may include the second to fourth inversion parts 320B to 320D, and the second to fourth latch parts 330B to 330D, respectively.

The inversion control circuit 310 may generate a first flip signal FLIP_EN1 and a second flip signal FLIP_EN2 by decoding the chip ID signal SID<1:0> according to the first to fourth strobe signals RDQSI, RDQSIB, RDQSQ and RDQSQB. In FIG. 5, a case where the inversion control circuit 310 is included in the first transmission circuit 210A has been described as an example, but the present invention is not limited thereto. According to an embodiment, the inversion control circuit 310 may be provided outside the first transmission circuit 210 in the base chip 114, or may be disposed in duplicate in each of the first to fourth transmitters 210A to 210D.

The inversion circuit 320 may output first to fourth inversion data pieces IDATA1 to IDATA4 by inverting the first and second interlayer data pieces TSV_D1 and TSV_D2 according to the first flip signal FLIP_EN1, and inverting the third and fourth interlayer data pieces TSV_D3 and TSV_D4 according to the second flip signal FLIP_EN2. In detail, the first inversion part 320A may output the first inversion data piece IDATA1 by inverting a phase of the first interlayer data piece TSV_D1 according to the first flip signal FLIP_EN1. The second inversion part 320B may output the second inversion data piece IDATA2 by inverting a phase of the second interlayer data piece TSV_D2 according to the first flip signal FLIP_EN1. The third inversion part 320C may output the third inversion data piece IDATA3 by inverting a phase of the third interlayer data piece TSV_D3 according to the second flip signal FLIP_EN2. The fourth inversion part 320D may output the fourth inversion data piece IDATA4 by inverting a phase of the fourth interlayer data piece TSV_D4 according to the second flip signal FLIP_EN2.

The latch circuit 330 may output the first to fourth internal data pieces TIO<3:0> to the transmission path TIO by latching the first to fourth inversion data pieces IDATA1 to IDATA4 according to the first to fourth strobe signals RDQSI, RDQSIB, RDQSQ and RDQSQB. In detail, the first latch part 330A may output the first internal data piece TIO<0> by latching the first inversion data piece IDATA1 according to the first and second strobe signals RDQSI and RDQSIB. The second latch part 330B may output the second internal data piece TIO<1> by latching the second inversion data piece IDATA2 according to the first and second strobe signals RDQSI and RDQSIB. The third latch part 330C may output the third internal data piece TIO<2> by latching the third inversion data piece IDATA3 according to the third and fourth strobe signals RDQSQ and RDQSQB. The fourth latch part 330D may output the fourth internal data piece TIO<3> by latching the fourth inversion data piece IDATA4 according to the third and fourth strobe signals RDQSQ and RDQSQB.

Figure 6:
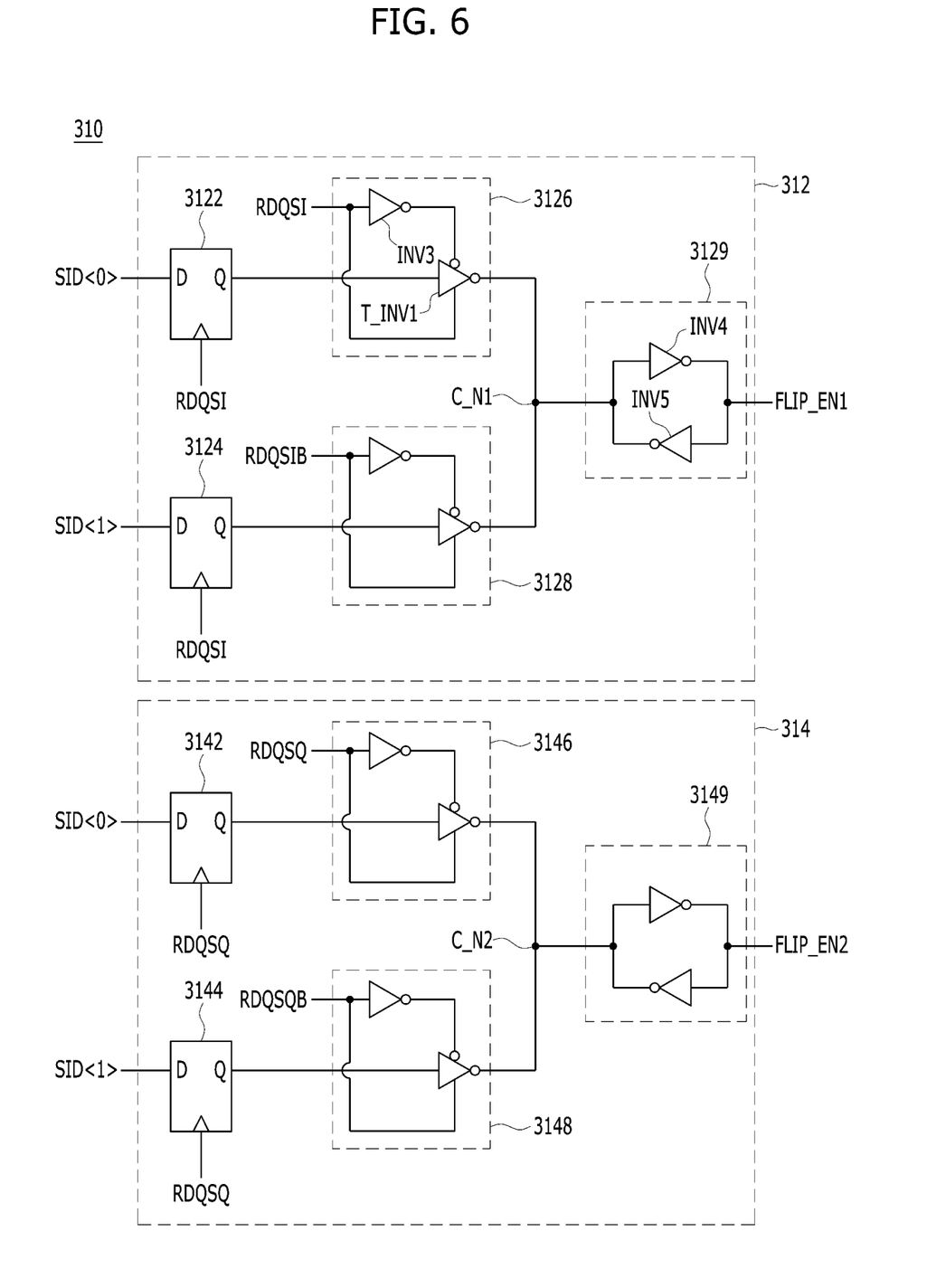
FIG. 6 is detailed circuits diagram illustrating an inversion control circuit of FIG. 5 in accordance with an embodiment of the present invention.

FIG. 6 is a detailed circuits diagram illustrating the inversion control circuit 310 of FIG. 5, in accordance with an embodiment of the present invention.

Referring to FIG. 6, the inversion control circuit 310 may include a first signal generation circuit 312 and a second signal generation circuit 314.

The first signal generation circuit 312 may include a first flip-flop 3122, a second flip-flop 3124, a first inverting transfer part 3126, a second inverting transfer part 3128, and a first inverting latch 3129. The first flip-flop 3122 may latch the first bit SID<0> of the chip ID signal SID<1:0> according to the first strobe signal RDQSI, and the second flip-flop 3124 may latch the second bit SID<1> of the chip ID signal SID<1:0> according to the first strobe signal RDQSI. The first inverting transfer part 3126 may invert and transfer an output of the first flip-flop 3122 to a first common node C_N1, according to the first strobe signal RDQSI. The first inverting transfer part 3126 may include an inverter INV3 for inverting the first strobe signal RDQSI, and a tri-state inverter T_INV1 for inverting the output of the first flip-flop 3122 in response to the first strobe signal RDQSI and an output of the inverter INV3. The second inverting transfer part 3128 may invert and transfer an output of the second flip-flop 3124 to the first common node C_N1, according to the second strobe signal RDQSIB. The second inverting transfer part 3128 may have substantially the same configuration as that of the first inverting transfer part 3126. The first inverting latch 3129 may generate the first flip signal FLIP_EN1 at an output node by inverting and latching a signal at the first common node C_N1. The first inverting latch 3129 may include two cross-coupled inverters INV4 and INV5 coupled between the first common node C_N1 and the output node in parallel.

With the above configuration, the first signal generation circuit 312 may generate the first flip signal FLIP_EN1 by latching the first bit SID<0> and the second bit SID<1> of the chip ID signal SID<1:0> according to the first strobe signal RDQSI, and sequentially outputting the latched bits according to the first and second strobe signals RDQSI and RDQSIB.

The second signal generation circuit 314 may include a third flip-flop 3142, a fourth flip-flop 3144, a third inverting transfer part 3146, a fourth inverting transfer part 3148, and a second inverting latch 3149. The third flip-flop 3142 may latch the first bit SID<0> of the chip ID signal SID<1:0> according to the third strobe signal RDQSQ, and the fourth flip-flop 3144 may latch the second bit SID<1> of the chip ID signal SID<1:0> according to the third strobe signal RDQSQ. The third inverting transfer part 3146 may invert and transfer an output of the third flip-flop 3142 to a second common node C_N2, according to the third strobe signal RDQSQ. The fourth inverting transfer part 3148 may invert and transfer an output of the fourth flip-flop 3144 to the second common node C_N2, according to the fourth strobe signal RDQSQB. The third inverting transfer part 3146 and the fourth inverting transfer part 3148 may have substantially the same configuration as that of the first inverting transfer part 3126. The second inverting latch 3149 may generate the second flip signal FLIP_EN2 at an output node by inverting and latching a signal at the second common node C_N2. The second inverting latch 3149 may have substantially the same configuration as that of the first inverting latch 3129.

With the above configuration, the second signal generation circuit 314 may generate the second flip signal FLIP_EN2 by latching the first bit SID<0> and the second bit SID<1> of the chip ID signal SID<1:0> according to the third strobe signal RDQSQ, and sequentially outputting the latched bits according to the third and fourth strobe signals RDQSQ and RDQSQB.

Figure 7:
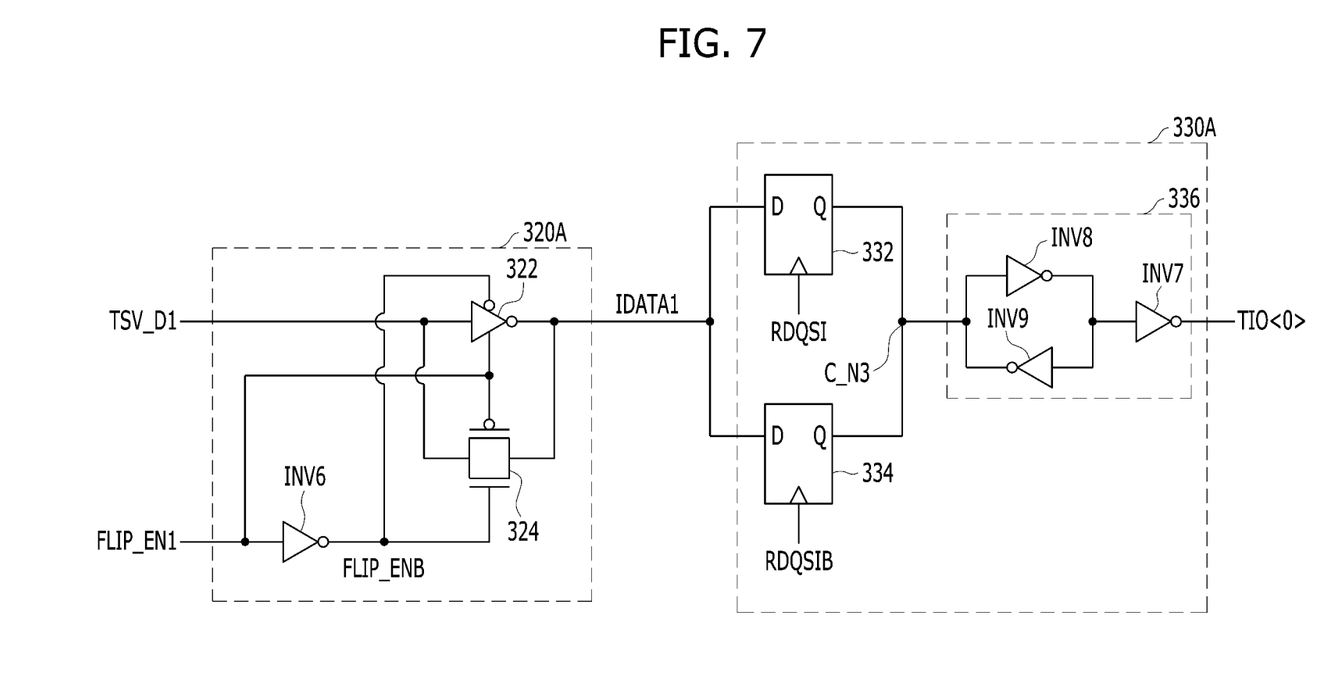
FIG. 7 is a detailed circuit diagram illustrating an inversion circuit and a latch circuit of FIG. 5 in accordance with an embodiment of the present invention.

FIG. 7 is a detailed circuit diagram illustrating the inversion circuit 320 and the latch circuit 330 of FIG. 5 in accordance with an embodiment of the present invention. In FIG. 7, only the first inversion part 320A and the first latch part 330A are shown, and the other inversion parts 320B to 320D and the latch parts 330B to 330D may have substantially the same configuration as those of the first inversion part 320A and the first latch part 330A, respectively.

Referring to FIG. 7, the first inversion part 320A may include an inverter INV6, an inversion path 322, and a non-inversion path 324.

The inverter INV6 may generate an inverted flip signal FLIP_ENB by inverting the first flip signal FLIP_EN1. The inversion path 322 may output the first inversion data piece IDATA1 by inverting the first interlayer data piece TSV_D1 according to the first flip signal FLIP_EN1 and the inverted flip signal FLIP_ENB. The inversion path 322 may output the first inversion data piece IDATA1 by inverting the first interlayer data piece TSV_D1 when the first flip signal FLIP_EN1 is enabled to a logic high level. The inversion path 322 may be implemented with a tri-state inverter. The non-inversion path 324 may output the first inversion data piece IDATA1 without inverting the first interlayer data piece TSV_D1 according to the first flip signal FLIP_EN1 and the inverted flip signal FLIP_ENB. The non-inversion path 324 may output the first interlayer data piece TSV_D1 as the first inversion data piece IDATA1 when the inverted flip signal FLIP_ENB is enabled to a logic high level. The transfer part 324 may be implemented with a transfer gate. The inversion path 322 and the non-inversion path 324 may operate complementary to each other so that only one of the inversion path 322 and the non-inversion path 324 may output the first inversion data piece IDATA1.

With the above configuration, the first inversion part 320A may invert the phase of the first interlayer data piece TSV_D1 and output the first inversion data piece IDATA1 when the first flip signal FLIP_EN1 is enabled to a logic high level. On the contrary, the first inversion part 320A may output the first interlayer data piece TSV_D1 as the first inversion data piece IDATA1, without inverting the phase of the first interlayer data piece TSV_D1, when the first flip signal FLIP_EN1 is disabled to a logic low level.

The first latch part 330A may include a first section latch 332, a second section latch 334, and a latch outputter 336.

The first section latch 332 may latch and output the first inversion data piece IDATA1 to a third common node C_N3, according to the first strobe signal RDQSI. The second section latch 334 may latch and output the first inversion data piece IDATA1 to the third common node C_N3, according to the second strobe signal RDQSIB. The first section latch 332 and the second section latch 334 may be implemented with a flip-flop. The latch outputter 336 may re-latch a signal at the third common node C_N3 to output the first internal data piece TIO<O> to the transmission path TIO. The latch outputter 336 may include an inverting latch 3362 and an inverter INV7. The inverting latch 3362 may include two cross-coupled inverters INV8 and INV9 coupled between the third common node C_N3 and an output node (i.e., the transmission path TIO) in parallel.

With the above configuration, the first latch part 330A may sequentially latch the first inversion data piece IDATA1 according to the first and second strobe signals RDQSI and RDQSIB and transmit the latched data as the first internal data piece TIO<O> to the transmission path TIO.

Hereinafter, referring to FIGS. 2 to 8, a read test operation at a wafer level in accordance with an embodiment of the present invention will be described.

Figure 8:
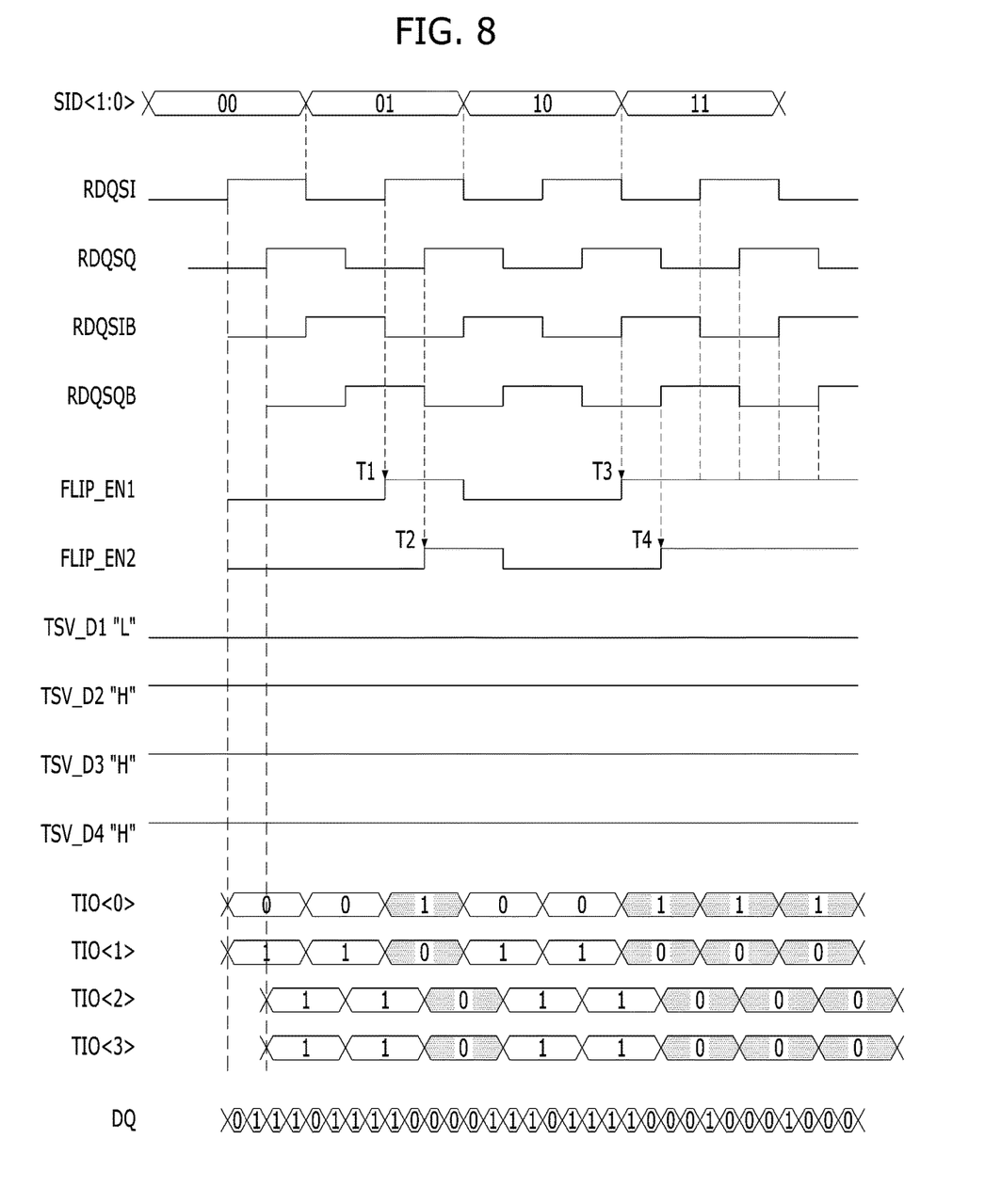
FIG. 8 is a timing diagram for describing a read test operation of a base chip at a wafer level in accordance with an embodiment of the present invention.

FIG. 8 is a timing diagram for describing a read test operation of the base chip 114 at a wafer level in accordance with an embodiment of the present invention.

Referring to FIG. 8, the last written data during a write test operation to the interlayer channels TSVR1, TSVR2, TSVF1 and TSVF2 are "L", "H", "H", and "H", respectively, and thus logic levels of the first to fourth interlayer data pieces TSV_D1 to TSV_D4 become "L", "H", "H", and "H", respectively. In FIG. 8, for convenience of description, a case where the chip ID signal SID<1:0> is sequentially provided with a sequence of "00", "01", "10", and "11" is illustrated.

During a test operation, since the DA mode signal DA_EN is enabled, the data DQ, the strobe signal DQS, the clock signal CK, and the command/address signal C/A may be respectively provided from the external test device through the data pad DA_DQ_P, the strobe pad DA_DQS_P, the clock pad DA_CK_P, and the command/address pad DA_CA_P disposed in the DA interface 117.

First, the CA buffer 258 may generate the internal command/address signal ICA by sampling the command/address signal C/A using the clock signal CK. The command decoder 260 may generate the read command RD and the preliminary ID signal PID<1:0> by decoding the internal command/address signal ICA. The strobe signal generation circuit 270 may generate the first to fourth strobe signals RDQSI, RDQSIB, RDQSQ and RDQSQB and generate the read strobe signal RDQS using the first to fourth strobe signals RDQSI, RDQSIB, RDQSQ and RDQSQB, based on the internal clock signal CLK when the read command RD is inputted. The timing control circuit 280 may delay the preliminary ID signal PID<1:0> by a predetermined time amount corresponding to the read latency (RL), and generate the chip ID signal SID<1:0> by aligning the delay preliminary ID signal according to the read strobe signal RDQS.

The first signal generation circuit 312 of the inversion control circuit 310 may generate the first flip signal FLIP_EN1 by latching the first bit SID<O> and the second bit SID<1> of the chip ID signal SID<1:0> according to the first strobe signal RDQSI, and sequentially outputting the latched bits according to the first and second strobe signals RDQSI and RDQSIB. Further, the second signal generation circuit 314 may generate the second flip signal FLIP_EN2 by latching the first bit SID<O> and the second bit SID<1> of the chip ID signal SID<1:0> according to the third strobe signal RDQSQ, and sequentially outputting the latched bits according to the third and fourth strobe signals RDQSQ and RDQSQB.

When the chip ID signal SID<1:0> of "01" is inputted, the first flip signal FLIP_EN1 corresponding to the first bit SID<O> may be enabled to a logic high level at a first timing T1 in synchronization with a rising edge of the first strobe signal RDQSI. Further, the second flip signal FLIP_EN2 corresponding to the first bit SID<O> may be enabled to a logic high level at a second timing T1 in synchronization with a rising edge of the third strobe signal RDQSQ.

When the chip ID signal SID<1:0> of "10" is inputted, the first flip signal FLIP_EN1 corresponding to the second bit SID<1> may be enabled to a logic high level at a third timing T3 in synchronization with a rising edge of the second strobe signal RDQSIB. Further, the second flip signal FLIP_EN2 corresponding to the second bit SID<1> may be enabled to a logic high level at a fourth timing T4 in synchronization with a rising edge of the fourth strobe signal RDQSQB.

When the chip ID signal SID<1:0> of "11" is inputted, the first flip signal FLIP_EN1 and the second flip signal FLIP_EN2 may maintain a logic high level in synchronization with a rising edge of each of the first to fourth strobe signals RDQSI, RDQSIB, RDQSQ and RDQSQB.

According to the first flip signal FLIP_EN1, the first inversion part 320A may invert the phase of the first interlayer data piece TSV_D1 to output the first inversion data piece IDATA1, and the second inversion part 320B may invert the phase of the second interlayer data piece TSV_D2 to output the second inversion data piece IDATA2. According to the second flip signal FLIP_EN2, the third inversion part 320C may invert the phase of the third interlayer data piece TSV_D3 to output the third inversion data piece IDATA3, and the fourth inversion part 320D may invert the phase of the fourth interlayer data piece TSV_D4 to output the fourth inversion data piece IDATA4.

The first to fourth latch parts 330A to 330D may output the first to fourth internal data pieces TIO<3:0> to the transmission path TIO by latching the first to fourth inversion data pieces IDATA1 to IDATA4, according to the first to fourth strobe signals RDQSI, RDQSIB, RDQSQ and RDQSQB. The second transmission circuit 242 may output the first to fourth internal data pieces TIO<3:0> from the transmission path TIO to the data pad DA_DQ_P through the first selection circuit 292. The external test device may verify whether the transmission circuits 210 and 242 involved in the read test operation operate properly using the data DQ As described above, according to an embodiment of the present invention, various test patterns may be generated by inverting at least some pieces of the interlayer data according to the chip ID signal SID<1:0> originated from the command/address signal C/A, and a read path of the base chip 114 may be tested at the wafer level by using the generated test patterns, thereby improving the reliability of the base chip 114 and the stacked memory device 110 to be configured by the base chip 114.

While the present teachings have been described with respect to specific embodiments, it will be apparent to those skilled in the art that various changes and modifications may be made without departing from the spirit and scope of the present invention as defined in the following claims.

For example, the logic gates and transistors described in the above embodiments may have different positions and types according to the polarity of input signals. Furthermore, the embodiments may be combined to form additional embodiments.

What is claimed is:

1. An integrated circuit (IC) chip, comprising:
a plurality of interlayer channels;
at least one data pad;
an identification (ID) generation circuit suitable for generating a chip ID signal by decoding a command/address signal;
a first transmission circuit suitable for transferring a plurality of internal data pieces to a transmission path by aligning a plurality of interlayer data pieces respectively transferred from the plurality of interlayer channels according to a plurality of strobe signals while selectively inverting the plurality of interlayer data pieces according to the chip ID signal; and
a second transmission circuit suitable for transferring the plurality of internal data pieces from the transmission path to the at least one data pad.

2. The IC chip of claim 1, wherein the ID generation circuit includes:
a command decoder suitable for generating a preliminary ID signal by decoding the command/address signal; and
a timing control circuit suitable for delaying the preliminary ID signal by a predetermined time amount and generating the chip ID signal by aligning the delay preliminary ID signal according to the plurality of strobe signals.

3. The IC chip of claim 1,
wherein the chip ID signal includes a plurality of bits,
wherein the plurality of internal data pieces includes first to fourth internal data pieces, and
wherein the first transmission circuit transfers to the transmission path, when any of the plurality of bits becomes a high bit, the first and second internal data pieces by inverting the first and second interlayer data pieces according to first and second strobe signals or the third and fourth internal data pieces by inverting the third and fourth interlayer data pieces according to third and fourth strobe signals.

4. The IC chip of claim 1,
wherein the plurality of interlayer data pieces includes first to fourth interlayer data pieces,
wherein the plurality of internal data pieces includes first to fourth internal data pieces, and
wherein the first transmission circuit includes:
an inversion control circuit suitable for generating a first flip signal and a second flip signal by decoding the chip ID signal according to first to fourth strobe signals;
an inversion circuit suitable for outputting first to fourth inversion data pieces by inverting phases of the first and second interlayer data pieces according to the first flip signal and by inverting phases of the third and fourth interlayer data pieces according to the second flip signal; and
a latch circuit suitable for outputting the first to fourth internal data pieces to the transmission path by latching the first to fourth inversion data pieces according to the first to fourth strobe signals.

5. The IC chip of claim 4, wherein the inversion control circuit includes:
a first signal generation circuit suitable for generating the first flip signal by latching first and second bits of the chip ID signal according to the first strobe signal and sequentially outputting the latched bits according to the first and second strobe signals; and
a second signal generation circuit suitable for generating the second flip signal by latching the first and second bits of the chip ID signal according to the third strobe signal and sequentially outputting the latched bits according to the third and fourth strobe signals.

6. The IC chip of claim 1, wherein the IC chip includes a base chip configuring a High Bandwidth Memory (HBM).

7. The IC chip of claim 1,
wherein the plurality of interlayer channels includes through-electrodes for communication between stacked chips, and
wherein the at least one data pad is provided to transmit and receive data to and from an external device.

8. An integrated circuit (IC) chip, comprising:
at least four interlayer channels;
at least one data pad;
an inversion control circuit suitable for generating a first flip signal and a second flip signal by decoding a chip identification (ID) signal according to a plurality of strobe signals;
an inversion circuit suitable for outputting first to fourth inversion data pieces by selectively inverting, according to the first flip signal and the second flip signal, first to fourth interlayer data pieces transferred from the at least four interlayer channels;
a latch circuit suitable for outputting first to fourth internal data pieces to a transmission path by latching the first to fourth inversion data pieces according to the plurality of strobe signals; and
a transmission circuit suitable for serializing the first to fourth internal data pieces to transfer the serialized data from the transmission path to the at least one data pad.

9. The IC chip of claim 8, further comprising:
an ID generation circuit suitable for generating the chip ID signal by generating a preliminary ID signal by decoding a command/address signal and aligning the preliminary ID signal according to the plurality of strobe signals.

10. The IC chip of claim 8, further comprising:
a command decoder suitable for generating a read command and a preliminary ID signal by decoding a command/address signal;
a strobe signal generation circuit suitable for generating the plurality of strobe signals according to the read command; and
a timing control circuit suitable for delaying the preliminary ID signal by a predetermined time amount and generating the chip ID signal by aligning the delayed preliminary ID signal according to the plurality of strobe signals.

11. The IC chip of claim 8,
wherein the plurality of strobe signals include first to fourth strobe signals, and
wherein the inversion control circuit includes:
a first signal generation circuit suitable for generating the first flip signal by latching first and second bits of the chip ID signal according to the first strobe signal and sequentially outputting the latched bits according to the first and second strobe signals; and
a second signal generation circuit suitable for generating the second flip signal by latching the first and second bits of the chip ID signal according to the third strobe signal and sequentially outputting the latched bits according to the third and fourth strobe signals.

12. The IC chip of claim 11, wherein the first signal generation circuit includes:
   first and second flip-flops suitable for latching the first and second bits of the chip ID signal according to the first strobe signal;
   a first inverting transfer part suitable for inverting and transferring an output of the first flip-flop to a first common node, according to the first strobe signal;
   a second inverting transfer part suitable for inverting and transferring an output of the second flip-flop to the first common node, according to the second strobe signal; and
   a first inverting latch suitable for generating the first flip signal by inverting and latching a signal at the first common node.

13. The IC chip of claim 11, wherein the second signal generation circuit includes:
   third and fourth flip-flops suitable for latching the first and second bits of the chip ID signal according to the third strobe signal;
   a third inverting transfer part suitable for inverting and transferring an output of the third flip-flop to a second common node, according to the third strobe signal;
   a fourth inverting transfer part suitable for inverting and transferring an output of the fourth flip-flop to the second common node, according to the fourth strobe signal; and
   a second inverting latch suitable for generating the second flip signal by inverting and latching a signal at the second common node.

14. The IC chip of claim 8, wherein the inversion circuit includes:
   an inversion path suitable for outputting the first and second inversion data pieces by inverting the first and second interlayer data pieces when the first flip signal is enabled, and outputting the third and fourth inversion data pieces by inverting the third and fourth interlayer data pieces when the second flip signal is enabled; and
   a non-inversion path suitable for outputting the first and second inversion data pieces without inverting the first and second interlayer data pieces when the first flip signal is disabled, and outputting the third and fourth inversion data pieces without inverting the third and fourth interlayer data pieces when the second flip signal is disabled.

15. The IC chip of claim 8,
   wherein the plurality of strobe signals include first to fourth strobe signals having different phases from each other, and
   wherein the latch circuit is suitable for:
   outputting the first internal data piece by latching the first inversion data piece according to the first and second strobe signals,
   outputting the second internal data piece by latching the second inversion data piece according to the first and second strobe signals,
   outputting the third internal data piece by latching the third inversion data piece according to the third and fourth strobe signals, and
   outputting the fourth internal data piece by latching the fourth inversion data piece according to the third and fourth strobe signals.

16. The IC chip of claim 8, wherein the IC chip includes a base chip configuring a High Bandwidth Memory (HBM).

17. The IC chip of claim 8,
   wherein the at least four interlayer channels include through-electrodes for communication between stacked chips, and
   wherein the at least one data pad is provided to transmit and receive data to and from an external device.

18. An operating method of an integrated circuit chip, the operating method comprising:
   generating chip ID bits based on a command/address signal;
   generating, according to first and second strobe signals, a first flip signal from the chip ID bits latched according to the first strobe signal;
   generating, according to third and fourth strobe signals, a second flip signal from the chip ID bits latched according to the third strobe signal;
   generating first and second inversion data pieces by selectively inverting first and second interlayer data pieces according to the first flip signal;
   generating third and fourth inversion data pieces by selectively inverting third and fourth interlayer data pieces according to the second flip signal;
   generating a first internal data piece from the first inversion data piece according to the first and second strobe signals;
   generating a second internal data piece from the second inversion data piece according to the first and second strobe signals;
   generating a third internal data piece from the third inversion data piece according to the third and fourth strobe signals;
   generating a fourth internal data piece from the fourth inversion data piece according to the third and fourth strobe signals; and
   outputting the first to fourth internal data pieces through a single data pad,
   wherein the first to fourth strobe signals have different phases, and
   wherein the first to fourth interlayer data pieces are provided respectively from first to fourth interlayer channels included in the integrated circuit chip.

* * * * *